United States Patent
Son et al.

(10) Patent No.: US 9,810,757 B2
(45) Date of Patent: Nov. 7, 2017

(54) HIGH-SPEED MAGNETIC RESONANCE IMAGING METHOD AND APPARATUS

(71) Applicant: Samsung Electronics Co., Ltd., Suwon-si (KR)

(72) Inventors: Jong-bum Son, Seongnam-si (KR); Seong-deok Lee, Seongnam-si (KR); Jaemock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 888 days.

(21) Appl. No.: 14/075,655

(22) Filed: Nov. 8, 2013

(65) Prior Publication Data

US 2014/0184221 A1    Jul. 3, 2014

(30) Foreign Application Priority Data

Dec. 28, 2012  (KR) ........................ 10-2012-0157334

(51) Int. Cl.
*G01V 3/00* (2006.01)
*G01R 33/48* (2006.01)
*G01R 33/561* (2006.01)

(52) U.S. Cl.
CPC ....... *G01R 33/482* (2013.01); *G01R 33/5619* (2013.01)

(58) Field of Classification Search
CPC .... A61B 5/055; G01R 33/4828; G01R 33/50; G01R 33/5608; G01R 33/543
USPC ....................................................... 324/309
See application file for complete search history.

(56) References Cited

U.S. PATENT DOCUMENTS

| | | | | |
|---|---|---|---|---|
| 5,270,654 A | * | 12/1993 | Feinberg | G01R 33/5615 324/307 |
| 5,581,181 A | * | 12/1996 | Fuderer | G01R 33/56554 324/309 |
| 6,255,820 B1 | | 7/2001 | Steckner | |
| 7,974,679 B2 | | 7/2011 | Zhou | |
| 8,040,135 B1 | | 10/2011 | Cukur et al. | |
| 8,217,650 B2 | | 7/2012 | Sueoka | |
| 2004/0257079 A1 | * | 12/2004 | Dumoulin | G01R 33/3415 324/318 |
| 2007/0276220 A1 | * | 11/2007 | Harvey | G01R 33/543 600/410 |
| 2008/0246475 A1 | * | 10/2008 | Adachi | G01R 33/56572 324/307 |
| 2010/0205143 A1 | * | 8/2010 | Kroeker | G01R 33/4818 707/602 |
| 2012/0112743 A1 | * | 5/2012 | Granlund | G01R 33/5614 324/309 |

FOREIGN PATENT DOCUMENTS

KR          10-1030676 B1    4/2011

* cited by examiner

*Primary Examiner* — Walter L Lindsay, Jr.
*Assistant Examiner* — Frederick Wenderoth
(74) *Attorney, Agent, or Firm* — NSIP Law

(57) ABSTRACT

Provided are high-speed magnetic resonance imaging methods and apparatuses that enable simultaneously obtaining magnetic resonance images with different resolutions. The present embodiments may produce magnetic resonance images with different resolutions more quickly by decreasing time taken to complete scan operations that are performed for producing the magnetic resonance images.

26 Claims, 5 Drawing Sheets

HIGH-SPEED MAGNETIC RESONANCE IMAGING METHOD AND APPARATUS

CROSS-REFERENCE TO RELATED APPLICATIONS

This application claims the benefit of Korean Patent Application No. 10-2012-0157334 filed on Dec. 28, 2012, in the Korean Intellectual Property Office, the entire disclosure of which is incorporated herein by reference for all purposes.

BACKGROUND

1. Field

The following description relates to high-speed magnetic resonance imaging methods and apparatuses, and more particularly, to high-speed magnetic resonance imaging methods and apparatuses that simultaneously obtain magnetic resonance images with different resolutions.

2. Description of the Related Art

Magnetic resonance imaging (MRI) refers to a process of producing images from information that is obtained through resonance after an atomic nucleus is exposed to a magnetic field. The nuclear magnetic resonance (NMR) of the atomic nucleus applies to a phenomenon that when specific high-frequency energy enters an atomic nucleus magnetized by an external magnetic field, an atomic nucleus in a low energy state absorbs high-frequency energy and is excited to a high energy state. Such excited nuclei then re-emit the energy. By gathering and processing the re-mitted energy, it is possible to gather information about the atomic nuclei being scanned. Atomic nucleuses have different resonant frequencies depending on their types and resonance is affected by the intensity of the external magnetic field. There are numerous atomic nucleuses in a human body, and atoms possessing magnetic resonance properties include $^{1}H$, $^{23}Na$, $^{31}P$, $^{13}C$. For example, a hydrogen nucleus is used to produce the MRI information, because it is an isotope with an odd number of protons.

Certain MRI methods produce magnetic resonance images with different resolutions by obtaining the magnetic resonance images individually. For example, the MRI scanner may be designed to use different settings during different scan processes that cause each of the acquired scans to have different resolutions.

SUMMARY

Provided are high-speed magnetic resonance imaging methods and apparatuses that enable simultaneously obtaining magnetic resonance images with different resolutions. In addition, provided are non-transitory computer readable media having recorded thereon a program to execute the methods for the high-speed magnetic resonance imaging on a computer. Technical tasks to be accomplished by embodiments are not limited to those described above and other technical tasks may be inferred from the following embodiments.

Additional aspects will be set forth in part in the description which follows and, in part, will be apparent from the description, or may be learned by practice of the presented embodiments.

According to an aspect of the present disclosure there is provided a high-speed magnetic resonance imaging (MRI) method including applying, to a subject, a radio frequency (RF) pulse sequence, splitting magnetic resonance signals produced in response to the RF pulse sequence based on sampling intervals, wherein sampling intervals of the magnetic resonance signals vary, and producing magnetic resonance images with different resolutions using the split magnetic resonance signals.

In an embodiment, the magnetic resonance images with different resolutions are produced simultaneously.

In an embodiment, the method further includes applying, to the subject, a plurality of gradients that form gradient fields in different directions, and wherein the magnetic resonance signals are also produced in response to the gradients.

In an embodiment, the gradients include a frequency encoding gradient that varies the sampling intervals based on a frequency encoding scheme.

In an embodiment, the changing of the frequency encoding scheme causes a change in a gradient of a gradient field that is formed by the frequency encoding gradient.

In an embodiment, the frequency encoding gradient decreases the gradient of the gradient field formed by the frequency encoding gradient if a magnetic resonance signal used for producing a lower-resolution image is sampled, and increases the gradient of the gradient field formed by the frequency encoding gradient if a magnetic resonance signal used for producing a high-resolution image is sampled.

In an embodiment, the sampling intervals are varied when the magnetic resonance signals are converted from an analog type to a digital type.

In an embodiment, the sampling intervals are narrowed if magnetic resonance signals used for producing lower-resolution images are sampled, and widened if magnetic resonance signals used for producing higher-resolution images are sampled.

In an embodiment, the magnetic resonance signals with varying sampling intervals have different spatial frequency intervals on a k-space.

In an embodiment, the magnetic resonance images with different resolutions comprise a full-length body image with a lower resolution and an expanded image of an area of interest with a higher resolution.

In an embodiment, the method further includes separately storing the split magnetic resonance signals, wherein the magnetic resonance images with different resolutions are simultaneously produced by using the magnetic resonance signals that are separately stored.

In another aspect, there is provided a non-transitory computer readable medium having recorded thereon a program to execute the method of embodiments, with a computer.

In another aspect, there is provided a high-speed magnetic resonance imaging (MRI) apparatus including a radio frequency (RF) coil configured to apply a radio frequency (RF) pulse sequence to a subject, a splitter configured to split magnetic resonance signals produced in response to the RF pulse sequence based on sampling intervals, wherein sampling intervals of the magnetic resonance signals vary, and a memory configured to separately store the split magnetic resonance signals to produce magnetic resonance images with different resolutions using the split magnetic resonance signals.

In an embodiment, the memory is configured to produce the magnetic resonance images with different resolutions simultaneously.

In an embodiment, the apparatus further includes a gradient coil configured to form gradient fields, the gradient fields having different directions, and configured to apply the gradient fields to the subject, wherein the magnetic resonance signals are also produced in response to the gradient fields.

In an embodiment, the gradient coil is configured to form a frequency encoding gradient that varies the sampling intervals based on a frequency encoding scheme.

In an embodiment, the changing of the frequency encoding scheme causes a change in a gradient of a gradient field that is formed by the frequency encoding gradient.

In an embodiment, the frequency encoding gradient decreases the gradient of the gradient field formed by the frequency encoding gradient if a magnetic resonance signal used for producing a lower-resolution image is sampled, and increases the gradient of the gradient field formed by the frequency encoding gradient if a magnetic resonance signal used for producing a higher-resolution image is sampled.

In an embodiment, the splitter varies the sampling intervals when the magnetic resonance signals are converted from an analog type to a digital type.

In an embodiment, the splitter narrows the sampling intervals if magnetic resonance signals used for producing lower-resolution images are sampled, and widens the sampling intervals if magnetic resonance signals used for producing higher-resolution images are sampled.

In an embodiment, the magnetic resonance signals with varying sampling intervals have different spatial frequency intervals on a k-space.

In an embodiment, the magnetic resonance images with different resolutions comprise a full-length body image with a lower resolution and an expanded image of an area of interest with a higher resolution.

In another aspect, there is provided a high-speed magnetic resonance imaging (MRI) apparatus including a signal obtainer configured to receive magnetic resonance signals emitted from a subject in response to a radio frequency (RF) pulse sequence, wherein sampling intervals of the magnetic resonance signals vary, a splitter configured to split the magnetic resonance signals based on the sampling intervals, and an operating console configured to produce magnetic resonance images with different resolutions, by using the split magnetic resonance signals.

In an embodiment, the operating console is configured to produce the magnetic resonance images with different resolutions simultaneously.

In an embodiment, the magnetic resonance signals emitted from the subject are also in response to gradients that form gradient fields in different directions.

In an embodiment, the magnetic resonance signals with varying sampling intervals have different spatial frequency intervals on a k-space.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
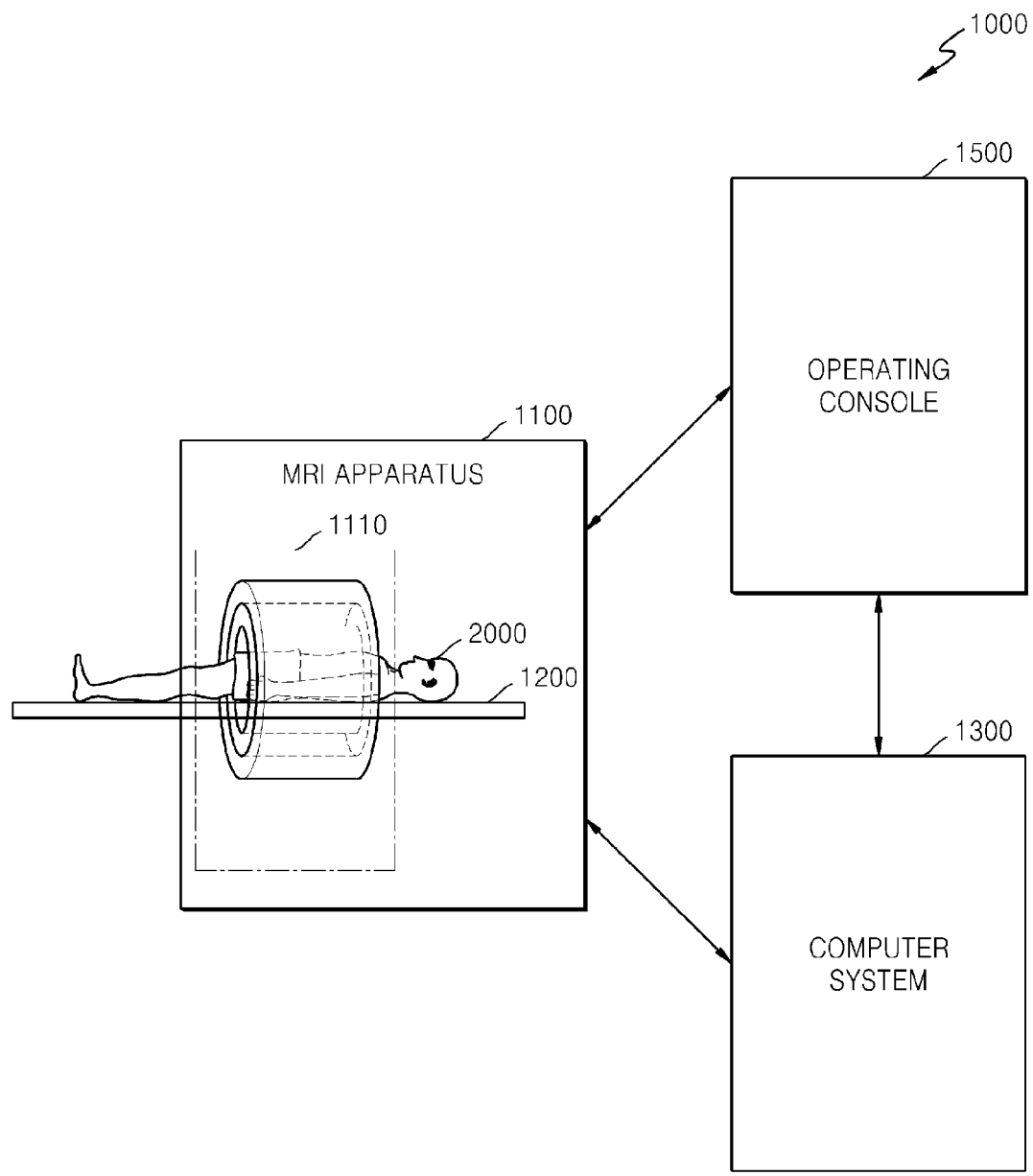
FIG. 1 is a view of a configuration schematically illustrating an entire structure of an MRI system.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The present disclosure will be described in detail with embodiments only for illustration not limitation while referring to the accompanying drawings. The following embodiments of the present disclosure are, of course, intended to specify the present disclosure, not to restrict or limit the scope of a right of the present disclosure. Matters that those skilled in the art can easily infer from the detailed description and embodiments of the present disclosure are construed as falling within the scope of the right of the present disclosure.

The following embodiments relate to MRI methods and apparatuses and matters well known to those skilled in the art are not described in detail.

FIG. 1 is a view of a configuration schematically illustrating an entire structure of an MRI system. The MRI system 1000 includes an MRI apparatus 1100, a computer system 1300, and an operating console 1500. In FIG. 1, these elements are separate from one another. In another embodiment, apparatuses included in the MRI system 1000 are not physically separated but some of them may be integrated, unlike in FIG. 1. In general, the MRI system 1000 includes parts that irradiate the subject 2000 with various forms of electromagnetic radiation, receive data describing emitted radiation resulting from a NMR phenomenon, and provide computing hardware to process and analyze the data to result in scanned images of the subject 2000.

The MRI apparatus 1100 receives a control signal for producing MRI imagery from the operating console 1500, operates in response to that the control signal, and obtains a magnetic resonance signal used for producing MRI images, from a subject 2000 that is located on a couch 1200 in a magnet system 1110. For example, the control signal controls various aspects and settings of the MRI apparatus to control how scans are acquired, such as resonance frequencies, power settings, gradient settings, and sampling intervals. The MRI apparatus 1100 outputs an image signal produced from the magnetic resonance signal received from the subject 2000, to the computer system 1300. For example, the image signal includes information about energy re-emitted by the constituent parts of the subject 2000 resulting from an NMR phenomenon.

The computer system 1300 receives and reconstructs an image signal from the MRI apparatus 1100, produces MRI images for a certain region of the subject 2000, and transfers the produced MRI images to the operating console 1500. In embodiments, the MRI images are stored as computer graphics files. For example, the computer graphics files are JPEG, GIF, PNG, BMP files, or another type of graphics file. In some examples, the graphics files are lossless, and in some examples, the graphics files are lossy. In some examples, the computer graphics files may also include color or grayscale information that indicates additional information produced by a scan. The computer system 1300 includes an image processing processor (not illustrated) that reconstructs the image signal produced from the magnetic resonance signal and produces a magnetic resonance image, a storage (not illustrated) that may store the image signal and the produced MRI image, and an interface unit (not illustrated) that is used for connection to the MRI apparatus 1100 and the operating console 1500. For example, the image processing processor may process the image signal to determine how different portions of the area scanned responded to the radiation and use this information to derive MRI images. In examples, the storage is a database or other data repository. An interface unit facilitates transfer of information between parts of an embodiment in order to allow them to work together on the MRI scan data.

The operating console 1500 includes a monitor (not illustrated) that receives and displays the produced MRI from the computer system 1300, various input units (not illustrated) such as a keyboard, a mouse, etc. that are used to receive control information from a user, and a panel (not illustrated) that shows scan conditions and scan situations. Thus, the operating console 1500 allows a user to interact with the remainder of an apparatus embodiment so as to control how images are acquired and work with the images subsequently.

Figure 2:
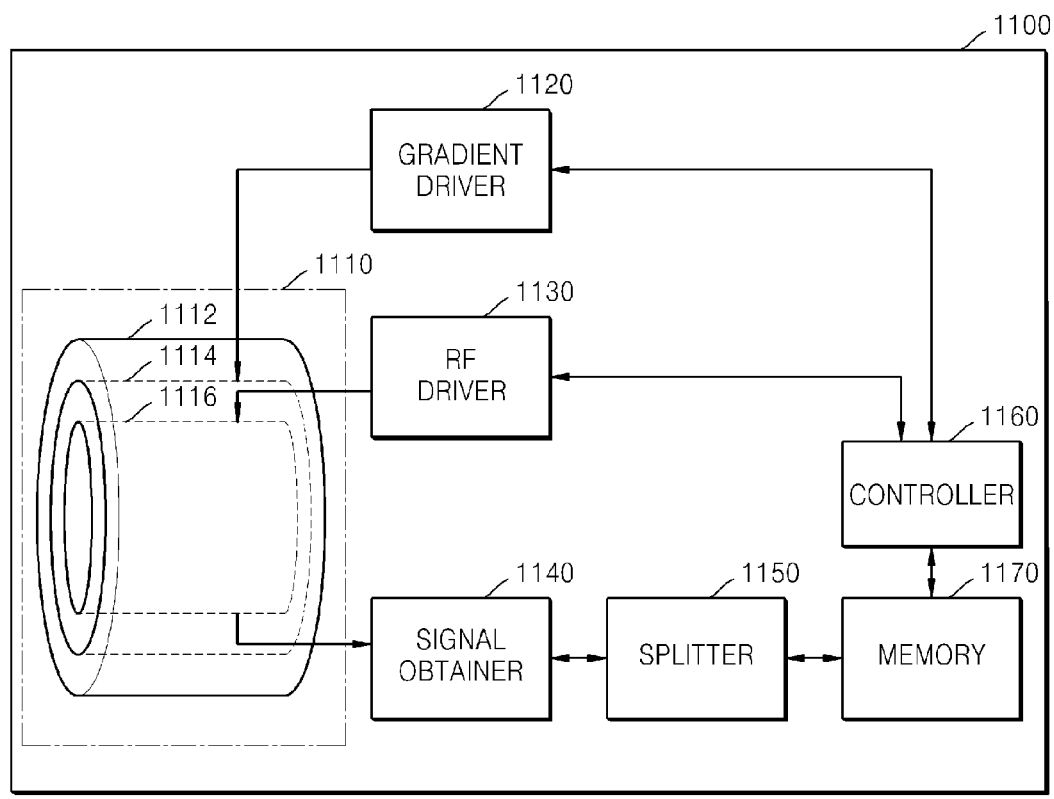
FIG. 2 is a view of an internal configuration of an MRI apparatus in an MRI system.

FIG. 2 is a view of an internal configuration of an MRI apparatus in an MRI system. The MRI apparatus 1100 applies a magnetic field at a certain frequency to the subject 2000 and obtains a magnetic resonance signal that is emitted from the subject 2000 in response to the magnetic field. Because certain isotopes of certain elements respond with a NMR phenomenon to certain specific resonant frequencies, the frequency of the magnetic field that is applied to the subject 2000 is chosen in keeping with the particular element and isotope whose presence is being considered. The MRI apparatus 1100 includes a magnet system 1110, a gradient driver 1120, a radio frequency (RF) driver 1130, a signal obtainer 1140, a splitter 1150, a controller 1160, and a memory 1170. The magnet system 1110 includes a main magnet 1112, a gradient coil 1114, and an RF coil (1116). These components of the apparatus work together, as discussed, to obtain a signal that represents the effects of subjecting the subject 2000 to specific frequencies of radiation and deducing the arrangement of matter inside the subject 2000 based the NMR response to the radiation.

The main magnet 1112 creates a static magnetic field in an inner space of the magnet system 1110. As will be discussed below, the static magnetic field produced by the main magnetic helps to allow the NMR response to occur. In embodiments, a direction of the static magnetic field is parallel or perpendicular to a body axis of the subject 2000, namely, the longitudinal axis of the subject 2000. Such an orientation of the static magnetic field makes it easier to obtain images aligned along axes of the subject 2000. In order to implement the main magnet 1112, in some embodiments a permanent magnet, a resistive magnet, or a superconductive magnet, etc., is used. For the convenience of description, an example case is described below as an embodiment where a horizontal static magnetic field parallel to the body axis of the subject 2000 is made using a superconductive magnet as the main magnet 1112. However, other embodiments operate with another main magnet 1112 that creates a static magnetic field. If the super conductive magnet is used as the main magnet 1112, the gradient coil 1114 and the RF coil 1116, in an embodiment, are arranged around a driving axis as illustrated in FIG. 2. That is, the main magnet 1112, the gradient coil 1114, and the RF coil 1116 are arranged in order from the outside of the magnet system 1110. This order helps facilitate directing electromagnetic radiation from the main magnet 1112, the gradient coil 1114, and the RF coil 1116 onto the subject 2000. The RF coil 1116 has a hollow structure such that the subject 2000 may be located therein. The subject 2000 is located on the couch 1200 which then moves into the magnet system 1110, and thus it is possible to apply a magnetic field and an RF pulse to the subject 2000, which are emitted by the parts of the magnet system 1110. Based on the electromagnetic energy incident upon the subject 2000, NMR effects result that characterize the interior of the subject 2000.

The MRI imagery technology is based on the fact that a hydrogen nucleus has magnetic moment, namely, magnetic dipole moment, due to spinning and a direction of the magnetic moment which has a random, uncertain organization when there is no external magnetic field. A hydrogen nucleus has such magnetic moment because it has an odd number of protons, since hydrogen has one proton. However, if hydrogen atoms lie in a static magnetic field, hydrogen nuclei become aligned in the direction of the static magnetic field in order to have a low energy state. In the case of the hydrogen nuclei, they have a Lamor frequency of 42.58 MHz in a magnetic field of 1.0 Tesla. If electronic wave pulse corresponding to such a Lamor frequency is applied to an atomic nucleus, an atomic nucleus with a low energy state transitions to a higher energy state. Subsequently, the excited hydrogen nuclei emit radiation, and measuring the radiation yields data that indicates the position of the hydrogen nuclei.

The gradient coil 1114 produces gradient fields in different directions and generally emits gradient fields onto the subject 2000 in three axial directions that are perpendicular to one another. If an RF pulse with the Lamor frequency is applied to the subject 2000 on which the static magnetic field is projected, magnetic resonance signals of tissues with similar properties are emitted simultaneously and thus it is difficult to know which signal is emitted from which position. The gradient field is used for solving such a limitation. By using a gradient field in which distribution of a magnetic field and Lamor frequency linearly change depending on the space, it is possible to selectively resonate a hydrogen nucleus in a certain region of the subject 2000 that corresponds to a region of interest. That is, when the subject 2000 is subjected to gradient fields in multiple dimensions, information about the gradients produced by the fields is used to deduce the location in the subject from which radiation is emitted.

Three axes perpendicular to one another define a slice axis, a frequency axis, and a phase axis, respectively. If three coordinate axes are referred to as axes x, y, and z that are perpendicular to one another in an inner space in which a static magnetic field is made, any of them may become a slice axis. When one of the axes is selected as a slice axis, one of the other two axes is a frequency axis, and the third becomes a phase axis. The slice axis may be set to be tilted at a certain angle with respect to the body axis of the subject 2000, namely, the longitudinal direction of the subject.

For example, the gradient coil 1114 makes three kinds of gradient fields in the directions of the x, y, and z axes. A gradient field is made along the body axis of the subject 2000 as a precondition to selectively excite a certain cross-section perpendicular to the body axis of the subject 2000, and in this case, a slice selection gradient is applied. In certain embodiments, in order to obtain 2D spatial information in a selected plane, methods such as frequency encoding gradient and phase encoding gradient methods are applied. Thus, the gradient coil 114 creates gradient fields that, when combined with information about the RF pulse, using appropriate MRI imaging techniques to derive images of the interior of the subject 2000.

Additionally, if the slice selection gradient is applied to make a gradient field in the direction of the z axis, in one embodiment the xy plane perpendicular to the z axis is selected. Images of such a perpendicular plan are especially useful because such images make it easier to identify features inside the subject 2000 such as organs, tissues, lesions, or the like. Frequency encoding gradient and phase encoding gradient methods are applied to obtain 2D positional information with respect to a selected 2D plane. For example, these gradients help determine the resolution and fidelity of resulting images. In a section of an RF pulse sequence corresponding to a specific repetition time, a certain phase difference is identified in the direction of the y axis on magnetic dipole moment of atomic nucleuses in a slice plane selected by using a phase encoding gradient, and a certain frequency difference is then made in the direction of the x axis by using a frequency encoding gradient with respect to any position on the y axis where the certain phase difference is made to obtain an echo signal. Manipulating gradients in such a manner allows a user to set attributes to be used when acquiring the MRI images.

Thus, it is possible to obtain an echo signal for a portion of a certain region of the subject 2000, namely, a k-space scan line signal corresponding to one line on a k-space. If echo signals are obtained in each of the other sections of the RF pulse sequence while making certain frequency differences in the direction of the x axis with respect to another position on the y axis by using phase encoding gradient and frequency encoding gradient methods, it is possible to obtain echo signals for of the entire contents of a certain region of the subject 2000. These echo signals are then processed based on the above information to yield images of the certain region of the subject 2000.

Each gradient coil 1114 uses at least two encoding schemes to produce images with different resolutions. Embodiments produce images with different resolutions because a lower resolution may suffice for certain parts of the subject 2000, but not others.

For example, in the case of a frequency encoding gradient method, a gradient field is made in the direction of a frequency axis and it is possible to change sampling intervals, namely, the number of sampling operations in a given time period, by changing a frequency encoding scheme. In this case, changing the frequency encoding scheme means changing a gradient of a gradient field made by frequency encoding gradient. The frequency encoding gradient decreases a gradient of a gradient field made by the frequency encoding gradient if sampling a magnetic resonance signal used for producing a lower-resolution image, and increases a gradient of a gradient field made by the frequency encoding gradient if sampling a magnetic resonance signal used for producing a higher-resolution image. By changing the gradient in this manner, the gradient increases the amount of information obtained during a scanning process where a higher-resolution image is desired, and decreases the amount of information obtained during a scanning process where a lower-resolution image is desired.

The RF coil 1116 applies an RF pulse to obtain a magnetic resonance signal from the subject 2000. In addition, it receives a magnetic resonance signal emitted from the subject 2000 in response to the applied RF pulse. That is, an RF coil, in one embodiment, has functions that both send the RF pulse and receive the magnetic resonance signal. However, in embodiments there may be separate RF coils 1116 that send and receive separately. The RF coil 1116 may apply various types of RF pulses to the subject 2000. For example, an excitation RF pulse or a refocusing RF pulse may be applied and each of them may be a 90° RF pulse and a 180° RF pulse. As discussed, the frequency of pulses may vary based on the type of matter being imaged. In addition, various kinds of RF pulse sequences including a plurality of RF pulses may be applied to the subject 2000, for example a spin echo, a fast spin echo, a gradient echo, a field echo, etc. These various groups of RF pulses yield different types of information about the underlying subject 2000.

The gradient driver 1120 is connected to the gradient coil 1114 and outputs a signal related to making a gradient field at the gradient coil 1114. The gradient driver 1120 includes gradient driving circuits that correspond respectively to three kinds of gradient coils for a slice axis, a frequency axis, and a phase axis. The gradient driver 1120 may include a waveform synthesizer (not illustrated) and an RF amplifier (not illustrated) to help it perform its functionality. The gradient drive 1120 provides functionality that constrains the gradients produced so as to provide images with sufficient resolution, as discussed elsewhere.

The RF driver 1130 is connected to the RF coil 1116. The RF driver 1130 produces an RF pulse and/or a pulse sequence that are intended to be applied from the RF coil 1116, and outputs them to the RF coil 1116 for application. As discussed, the pulse and/or pulse frequency are chosen with a specific frequency and timing so as to yield desired data for imaging. The RF driver 1130 optionally includes an RF oscillator (not illustrated) that oscillates an RF pulse, a phase shifter (not illustrated) that changes a phase, a waveform synthesizer (not illustrated) that makes a proper type of an RF pulse sequence, a modulator (not illustrated) that modulates an RF pulse sequence, and an RF amplifier (not illustrated) that amplifies RF pulses, to help it perform its functionality. In an embodiment, the RF driver 1130 is configured to integrate the signal obtainer 1140 with a transceiver.

The signal obtainer 1140 is connected to the RF coil 1116, obtains, demodulates and filters a magnetic resonance signal received from the RF coil 1116, and converts it to digital data. As discussed, various MRI approaches are used to receive the magnetic resonance signal and convert it into digital data. In some embodiments, the digital data takes the form of a graphic representing the matter scanned, but alternatively the digital data stores other information about the configuration of matter contained in the subject 2000. In one embodiment, the obtained magnetic resonance signal includes a free induction decay (FID) signal that is a response to an excitation RF pulse, and an echo signal that is a response to a refocusing RF pulse. Where both types of signal are acquired, optionally the two signals are combined to yield more accurate data. The signal obtainer 1140 may be implemented as a preamplifier (not illustrated) that amplifies received magnetic resonance signals, a demodulator (not illustrated) that demodulates amplified magnetic resonance signals, a low pass filter (LPF) that removes noise, and an analog digital converter (ADC, not illustrated) that converts demodulated analog signals into digital signals, to help it perform its functionality.

In one case that uses the ADC, sampling intervals of analog signals are managed, namely, the number of sampling operations in a time interval are regulated. For example, analog signals may be digitalized only at regular intervals at a fixed sampling rate and may also be digitalized at varying intervals at a variable sampling rate. Thus, the signal obtainer 1140 makes sampling intervals narrower by using the ADC when sampling a magnetic resonance signal used for producing a lower-resolution image, in order to convert the magnetic resonance signal from an analog type to a digital type.

Alternatively, the signal obtainer 1140 makes sampling intervals wider by using the ADC if sampling a magnetic resonance signal that is used for producing a higher-resolution image when converting the magnetic resonance signal from an analog type to a digital type. Again, the sampling rate varies in a way that allows more information to be acquired, when necessary, for higher-resolution images. In this case, as an example of each of the lower-resolution and higher-resolution images, a full-length body image and a lesion-expanded image will be described to characterize relationships between their characteristics and sampling intervals of magnetic resonance signals with reference to FIGS. 3A and 3B.

Figure 3A:
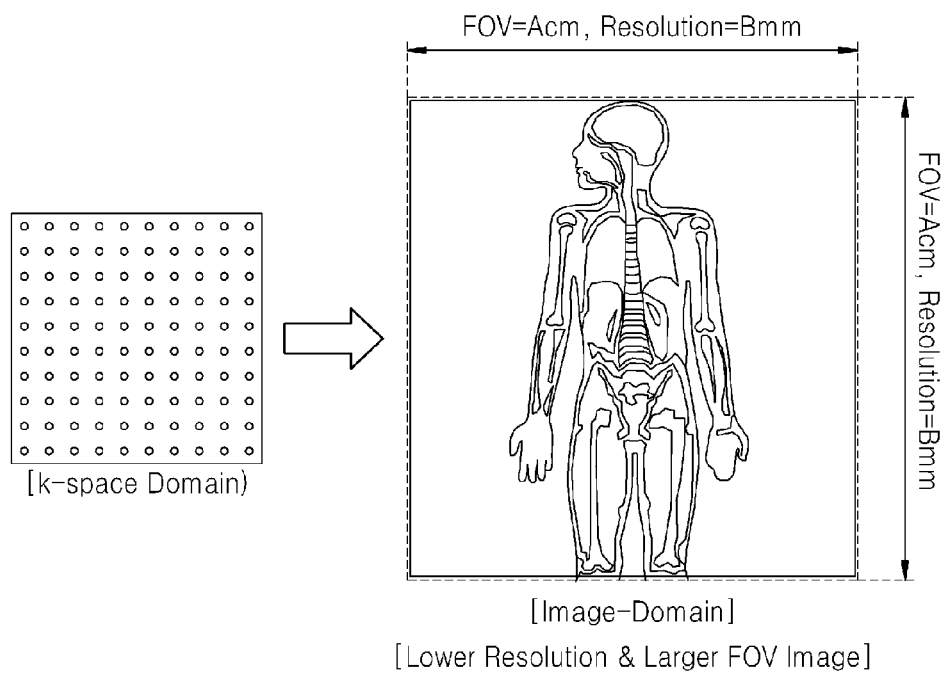
FIGS. 3A and 3B are views of a full-length body image with a lower resolution and a lesion-expanded image with a higher resolution, respectively.
Figure 3B:
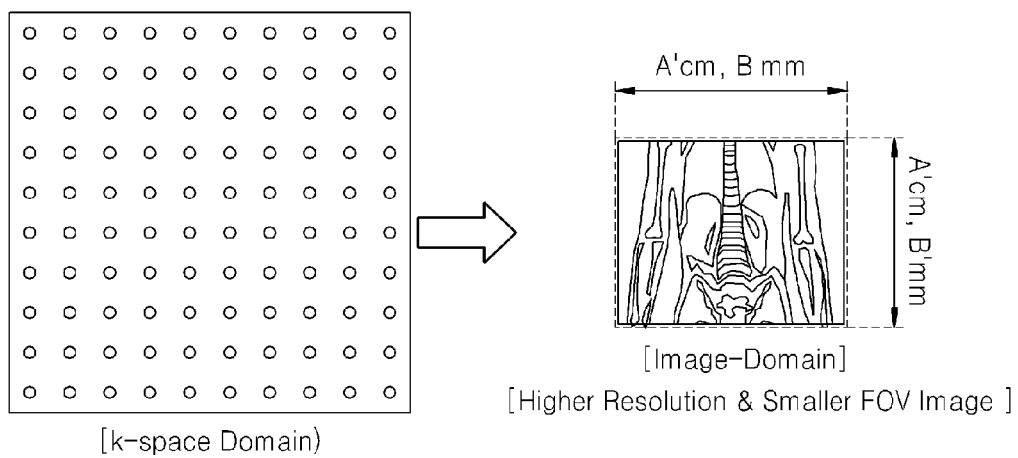

FIGS. 3A and 3B are views of a full-length body image with a lower resolution and a lesion-expanded image with a higher resolution, respectively.

As illustrated in FIG. 3A, the full-length body image with a lower resolution has the following characteristics. For example, it has a relatively wide field of view (FOV) of which width and length each are A cm, a lower resolution of B mm, and narrow sampling intervals between samples that configure a k-space. On the other hand, as illustrated in FIG. 3B, the lesion-expanded image with a higher resolution has the following characteristics. That, it has a relatively narrow FOV of which width and length each are A' cm, a higher resolution of B' mm, and wide sampling intervals between samples that configure the k-space. In this case, a value for A is greater than a value for A' and a value for B is greater than a value for B'. While FIG. B is presented as a view of a lesion, any area of interest in the subject 2000 may be presented in higher resolution.

However, sampling intervals between samples on each k-space are regular in two cases above. Thus, if two images have different FOVs and resolutions and sampling intervals between samples that configure the k-space are different from one another, it has traditionally been necessary to perform magnetic resonance scan processing two times in order to produce each magnetic resonance image. Embodiments offer an alternative.

Referring back to FIG. 2, before the magnetic resonance signals that are converted into digital types by the signal obtainer 1140 are stored in the memory 1170, the splitter 1150 splits the magnetic resonance signals on the basis of sampling intervals. By splitting the signals, it becomes possible to gather data that is intended for images of different resolutions. If sampling intervals of the magnetic resonance signals are changed by changing a frequency encoding scheme in frequency encoding gradient included in the gradient coil 1114 or changing a sampling rate by the signal obtainer 1140, the magnetic resonance signals are split on the basis of sampling intervals. Descriptions of the splitting will be made below in detail with reference to FIG. 4.

Figure 4:
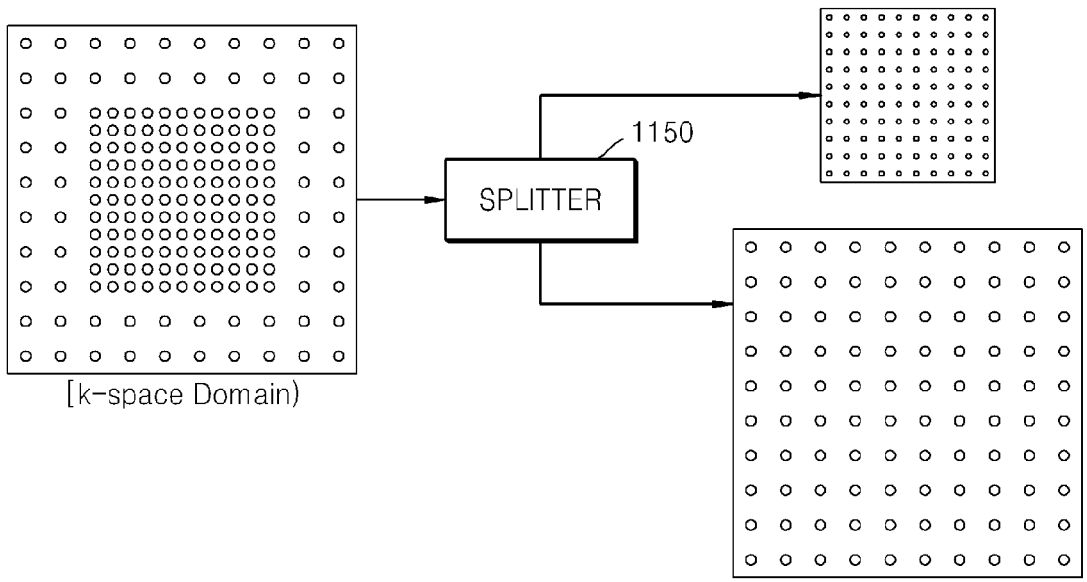
FIG. 4 is a view of splitting magnetic resonance signals that are obtained by changing the sampling intervals on the basis of sampling intervals.

FIG. 4 is a view of splitting, on the basis of sampling intervals, magnetic resonance signals that are obtained by changing the sampling intervals. The splitter 1150 splits the magnetic resonance signals on the basis of sampling intervals with respect to k-space scan line signals corresponding to one line on a k-space such that only the magnetic resonance signals with the same sampling interval accumulate. Thus, information corresponding to an area of interest that is to be portrayed at a higher resolution is split from information about an area to be portrayed at a lower resolution.

If magnetic resonance signals are split with respect to all scan line signals that configure the k-space, samples on one k-space are eventually split into samples on two k-spaces that are used for producing two magnetic resonance images. For example, if an image reconstruction process is performed on each split k-space, magnetic resonance images with different resolutions are simultaneously obtained. Such results are valuable because a unified processing approach is possible for multiple images.

Thus, while it has traditionally been necessary to perform magnetic resonance scan processing two times in order to produce two magnetic resonance images with different resolutions, performing the magnetic resonance scan process once in the present embodiment suffices. Thus it is possible to decrease time taken to complete scan operations. It is also possible to reduce processing and memory requirements.

Referring back to FIG. 2, the controller 1160 controls components of the MRI apparatus 1100 to obtain magnetic resonance signals. The controller 1160 receives a control signal transmitted from the operating console 1500 and controls the MRI apparatus 1100. The controller 1160 may store, in the memory 1170, programs related to the operations of the controller 1160, and various kinds of data related to applying RF pulses and pulse sequences. For example, the data may include information about power, frequency, and timing of pulses and pulse sequences.

Magnetic resonance signals split by the splitter 1150 are separately stored in the memory 1170 to be used for simultaneously producing magnetic resonance images with different resolutions. An array processor (not illustrated) performs Fourier transform on digital-type magnetic resonance signals stored in the memory 1170 to produce image signals and transfers produced image signals to the computer system 1300.

Figure 5:
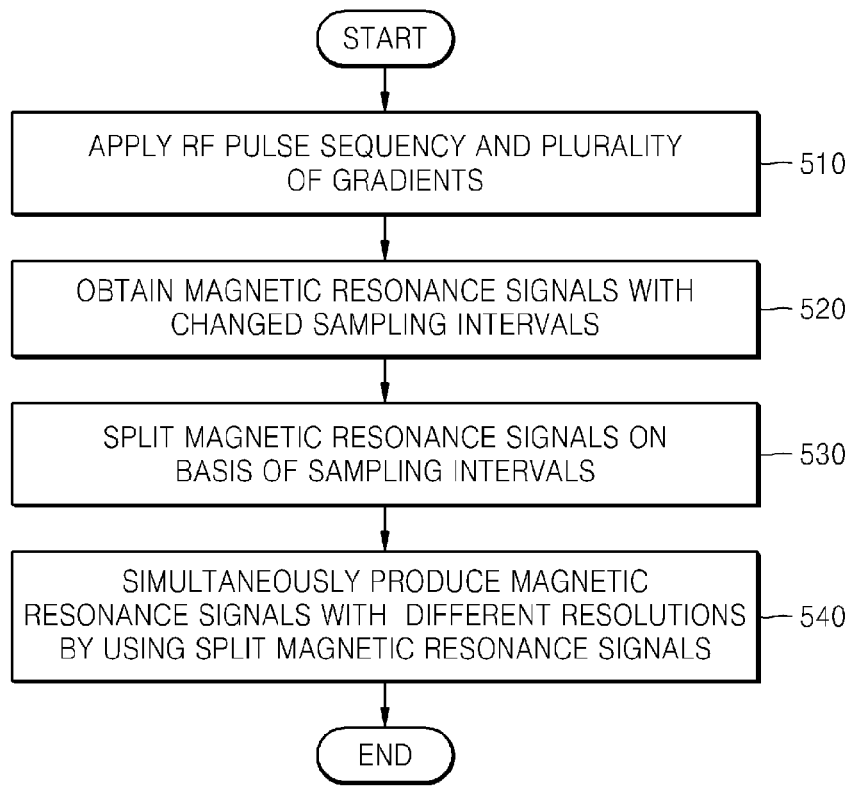
FIG. 5 is a flowchart illustrating an MRI method.

FIG. 5 is a flow chart of an MRI method.

In 510, an RF pulse sequence and a plurality of gradients that make each gradient field in different directions are applied to a subject. As discussed, applying the RF pulse sequence and gradients result in NMR emissions, which can be used to produce MRI images.

In 520, magnetic resonance signals are obtained by changing sampling intervals of magnetic resonance signals emitted from the subject. As a result, there are various sampling intervals on a k-space of the magnetic resonance signals. As discussed, changed intervals can lead to gathering information for imagery with different resolution. Additionally, some embodiments enable obtaining magnetic resonance signals by changing sampling intervals of magnetic resonance signals emitted from the subject, and related descriptions will be made below with reference to FIGS. 6 and 7.

Figure 6:
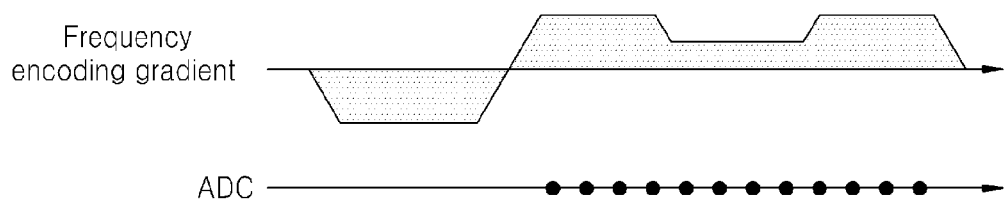
FIG. 6 is an embodiment illustrating changing sampling intervals that explains changing the sampling intervals by changing a frequency encoding scheme.

FIG. 6 is an embodiment illustrating changing sampling intervals that explains changing the sampling intervals by changing a frequency encoding scheme.

Referring to FIG. 6, it presents a scenario in which a frequency encoding scheme of a frequency encoding gradient is changed on the way. In particular, it may be seen that a middle part of a section with positive values has lower values than those on both sides of the section. The change of the frequency encoding scheme means changing a gradient of a gradient field made by the frequency encoding gradient. Referring to FIG. 6, it may be seen that a gradient of the gradient field with respect to a frequency axis increases, decreases and then increases. Because of this configuration, both sides to which frequency encoding is strongly applied have wide intervals between samples and the middle part at which the frequency encoding is weak has narrow intervals between samples.

Figure 7:
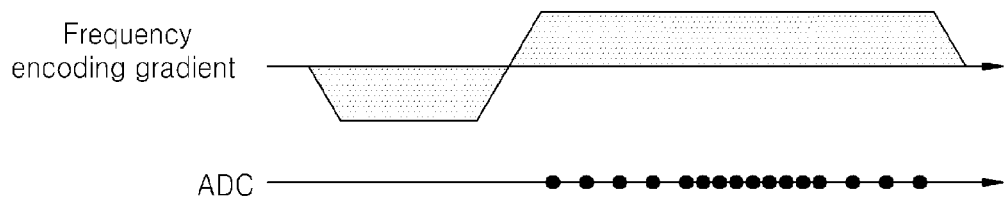
FIG. 7 is another embodiment illustrating changing sampling intervals that explains changing the sampling intervals when a magnetic resonance signal is converted from an analog type to a digital type.

FIG. 7 is another embodiment illustrating changing sampling intervals that explains changing the sampling intervals when a magnetic resonance signal is converted from an analog type to a digital type.

Unlike in FIG. 6, the sampling intervals may be changed by varying a sampling rate with respect to a magnetic resonance image in the ADC of the signal obtainer 1140 without changing the frequency encoding scheme in FIG. 7. In FIG. 7, there is no change in frequency encoding in a section with positive values but instead, the sampling rate varies in the ADC. In this case, the sampling rate gradually increases and then decreases and thus sampling intervals gets narrow and then gets wide, as well.

Referring back to FIG. 5, in 530, obtained magnetic resonance signals are split on the basis of sampling intervals. That is, with respect to samples with various sampling intervals on a k-space, samples with the same sampling interval are gathered together.

In 540, by using the split magnetic resonance signals, magnetic resonance images with different resolutions are simultaneously produced.

The high-speed MRI method according to an embodiment of the present disclosure described above can be written as computer programs and can be implemented in general-use digital computers that execute the programs using a computer readable recording medium. Examples of the computer readable recording medium include magnetic storage media (e.g., ROM, floppy disks, hard disks, etc.) and optical recording media (e.g., CD-ROMs, or DVDs).

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

As a non-exhaustive illustration only, a terminal/device/unit described herein may be a mobile device, such as a cellular phone, a personal digital assistant (PDA), a digital camera, a portable game console, an MP3 player, a portable/personal multimedia player (PMP), a handheld e-book, a portable laptop PC, a global positioning system (GPS) navigation device, a tablet, a sensor, or a stationary device, such as a desktop PC, a high-definition television (HDTV), a DVD player, a Blue-ray player, a set-top box, a home appliance, or any other device known to one of ordinary skill in the art that is capable of wireless communication and/or network communication.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The present embodiments may produce magnetic resonance images with different resolutions more quickly by decreasing time taken to complete scan operations that are performed for producing the magnetic resonance images.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present disclosure.

What is claimed is:

1. A high-speed magnetic resonance imaging (MRI) method comprising:
   applying, to a subject, a radio frequency (RF) pulse sequence;
   splitting magnetic resonance signals produced in response to the RF pulse sequence based on sampling intervals between samples that configure a k-space and based on image resolutions of magnetic resonance images corresponding to the magnetic resonance signals, wherein sampling intervals of the magnetic resonance signals vary; and
   producing the magnetic resonance images with different resolutions using the split magnetic resonance signals, wherein the magnetic resonance images with different resolutions comprise a full-length body image with a lower resolution and an expanded image of an area of interest with a higher resolution.

2. The high-speed MRI method of claim 1, wherein the magnetic resonance images with different resolutions are produced simultaneously.

3. The high-speed MRI method of claim 1, further comprising applying, to the subject, gradients that form gradient fields in different directions, and wherein the magnetic resonance signals are produced in response to the gradients.

4. The high-speed MRI method of claim 3, wherein the gradients comprise a frequency encoding gradient that varies the sampling intervals based on a frequency encoding scheme.

5. The high-speed MRI method of claim 4, wherein the changing of the frequency encoding scheme causes a change in a gradient of a gradient field formed by the frequency encoding gradient.

6. The high-speed MRI method of claim 5, wherein the frequency encoding gradient decreases the gradient of the gradient field formed by the frequency encoding gradient in response to a magnetic resonance signal used for producing a lower-resolution image being sampled, and increases the gradient of the gradient field formed by the frequency encoding gradient in response to a magnetic resonance signal used for producing a high-resolution image being sampled.

7. The high-speed MRI method of claim 1, wherein the sampling intervals are varied in response to the magnetic resonance signals being converted from an analog type to a digital type.

8. The high-speed MRI method of claim 7, wherein the sampling intervals are narrowed in response to magnetic resonance signals used for producing lower-resolution images being sampled, and widened in response to magnetic resonance signals used for producing higher-resolution images being sampled.

9. The high-speed MRI method of claim 1, wherein the magnetic resonance signals with varying sampling intervals have different spatial frequency intervals on a k-space.

10. The high-speed MRI method of claim 1, further comprising storing separately the split magnetic resonance signals, wherein the magnetic resonance images with different resolutions are simultaneously produced by using the magnetic resonance signals that are separately stored.

11. A non-transitory computer readable medium having recorded thereon a program to execute the method of claim 1 with a computer.

12. A high-speed magnetic resonance imaging (MRI) apparatus comprising:
   a radio frequency (RF) coil configured to apply a radio frequency (RF) pulse sequence to a subject;
   a splitter configured to split magnetic resonance signals produced in response to the RF pulse sequence based on sampling intervals between samples that configured a k-space and based on image resolutions of the magnetic resonance images corresponding to the magnetic resonance signals, wherein sampling intervals of the magnetic resonance signals vary; and
   a memory configured to separately store the split magnetic resonance signals to produce the magnetic resonance images with different resolutions using the split magnetic resonance signals, wherein the magnetic resonance images with different resolutions comprise a full-length body image with a lower resolution and an expanded image of an area of interest with a higher resolution.

13. The high-speed MRI apparatus of claim 12, wherein the memory is configured to produce the magnetic resonance images with different resolutions simultaneously.

14. The high-speed MRI apparatus of claim 12, further comprising:
a gradient coil configured to form gradient fields, the gradient fields having different directions, and configured to apply the gradient fields to the subject, wherein the magnetic resonance signals are produced in response to the gradient fields.

15. The high-speed MRI apparatus of claim 12, wherein the gradient coil is configured to form a frequency encoding gradient that varies the sampling intervals based on a frequency encoding scheme.

16. The high-speed MRI apparatus of claim 15, wherein the changing of the frequency encoding scheme causes a change in a gradient of a gradient field that is formed by the frequency encoding gradient.

17. The high-speed MRI apparatus of claim 16, wherein the frequency encoding gradient decreases the gradient of the gradient field formed by the frequency encoding gradient in response to a magnetic resonance signal used for producing a lower-resolution image being sampled, and increases the gradient of the gradient field formed by the frequency encoding gradient in response to a magnetic resonance signal used for producing a higher-resolution image being sampled.

18. The high-speed MRI apparatus of claim 12, wherein the splitter varies the sampling intervals in response to the magnetic resonance signals being converted from an analog type to a digital type.

19. The high-speed MRI apparatus of claim 18, wherein the splitter narrows the sampling intervals in response to magnetic resonance signals used for producing lower-resolution images being sampled, and widens the sampling intervals in response to magnetic resonance signals used for producing higher-resolution images being sampled.

20. The high-speed MRI apparatus of claim 12, wherein the magnetic resonance signals with varying sampling intervals have different spatial frequency intervals on a k-space.

21. A high-speed magnetic resonance imaging (MRI) apparatus comprising:
a signal obtainer configured to receive magnetic resonance signals emitted from a subject in response to a radio frequency (RF) pulse sequence, wherein sampling intervals of the magnetic resonance signals vary;
a splitter configured to split the magnetic resonance signals based on the sampling intervals between samples that configure a k-space and based on image resolutions of magnetic resonance images corresponding to the magnetic resonance signals; and
an operating console configured to produce the magnetic resonance images with different resolutions, by using the split magnetic resonance signals, wherein the magnetic resonance images with different resolutions comprise a full-length body image with a lower resolution and an expanded image of an area of interest with a higher resolution.

22. The high-speed MRI apparatus of claim 21, wherein the operating console is configured to produce the magnetic resonance images with different resolutions simultaneously.

23. The high-speed MRI apparatus of claim 21, wherein the magnetic resonance signals emitted from the subject are in response to gradients that form gradient fields in different directions.

24. The high-speed MRI apparatus of claim 21, wherein the magnetic resonance signals with varying sampling intervals have different spatial frequency intervals on a k-space.

25. The high-speed magnetic resonance imaging (MRI) method of claim 1, wherein the splitting the magnetic resonance signals groups together only magnetic resonance signals with a same sampling interval.

26. The high-speed magnetic resonance imaging (MRI) method of claim 1, wherein the producing the magnetic resonance images with different resolutions is conducted using a single magnetic resonance scanning process, and the expanded image comprises a lesion-specific image.

* * * * *